United States Patent [19]
Matsui

[11] Patent Number: 5,965,922
[45] Date of Patent: Oct. 12, 1999

[54] SEMICONDUCTOR MEMORY DEVICE COMPOSED OF HALF CELLS

[75] Inventor: Masataka Matsui, Yokohama, Japan

[73] Assignee: Kabushiki Kaisha Toshiba, Tokyo, Japan

[21] Appl. No.: 08/919,822

[22] Filed: Aug. 29, 1997

[30] Foreign Application Priority Data

Aug. 30, 1996 [JP] Japan ..................................... 8-231134

[51] Int. Cl.$^6$ .................................................. H01L 27/11
[52] U.S. Cl. ........................ 257/369; 257/377; 257/379; 257/382; 257/384; 257/401; 257/903
[58] Field of Search ................................... 257/368, 369, 257/379, 382, 384, 401, 377, 903

[56] References Cited

U.S. PATENT DOCUMENTS

| | | | |
|---|---|---|---|
| 5,382,807 | 1/1995 | Tsutsumi et al. | 257/69 |
| 5,592,013 | 1/1997 | Honda | 257/392 |
| 5,596,212 | 1/1997 | Kuriyama | 257/298 |
| 5,734,187 | 3/1998 | Bohr et al. | 257/377 |
| 5,780,910 | 7/1998 | Hashimoto et al. | 257/393 |

*Primary Examiner*—William Mintel
*Attorney, Agent, or Firm*—Loeb & Loeb LLP

[57] ABSTRACT

The disclosed semiconductor memory cell can be formed in accordance with the standard process for the logic LSI, so that the manufacturing cost can be reduced and an increased node capacitance can be secured. The drain diffusion layer (D1) of the latch transistor (M1) for constituting the latch of the memory cell is connected to a portion in the first metal layer through the contact (C1); the source diffusion layer (S1) of the latch transistor (M1) is the grounded wire connected to the first metal layer wire through the contacts (C3 and C3a); the poly silicon (P1) of the latch transistor (M1) is connected to the first metal layer wire or the second metal layer wire through the contact (C2); the first metal layer and the second metal layer are connected to each other by the through hole (V1) formed being overlapped with the contact (C3); the gate of the select transistor (M2) having the source connected to the drain diffusion layer (D1) of the latch transistor (M1) is connected to the word line (WL) of the poly silicon layer; the drain of the select transistor (M2) is connected to the first metal layer wiring through the contact (C4) and further connected to the bit lines formed in the second metal layer through the through hole (V2).

21 Claims, 11 Drawing Sheets

DIFFUSION LAYER

POLY SILICON

TRANSISTOR

CONTACT

1st THROUGH HOLE

PARTIAL LAYOUT OF
2nd METAL LAYER

SEMICONDUCTOR MEMORY DEVICE COMPOSED OF HALF CELLS

BACKGROUND OF THE INVENTION

1. Field of the Invention

The present invention relates to a semiconductor memory device, and more specifically to a layout and a circuit construction of MOSFET memory cells suitable for use as a large capacity memory such as on-chip cache memory, for instance.

2. Description of the Prior Art

Recently, there are many cases where memory cells are assembled in a logic LSI. These memory cells are called on-chip memory. For instance, a recent microprocessor LSI is assembled with a large capacity chip memory referred to as cache memory, and the microprocessor LSI on which one-port memory as large as several hundred kilo-bits is mounted has been reported. For several years, a memory whose capacity as large as this can be realized by use of only a general purpose memory LSI. Recently, however, a large capacity on-chip memory can be realized owing to the advanced microminiaturization in silicon process technique.

In this case, however, the area of the cache memory occupies as large an area of several percentage of the whole chip area of the microprocessor. In addition, it has been known that the performance of the microprocessor can be increased with increasing capacity of the cache memory, there exists such a tendency in the microprocessor that a cache memory of large capacity is mounted on the chip in as wide an area as possible.

As described above, in order to obtain a high performance logic LSI, it is an important technique to realize a memory cell of the smallest possible area on the chip.

At present, a static memory cell as shown in FIG. 6 is used for almost all the cache memories. Here, the static memory is constructed by four NMOS transistors 1, 2, 3 and 4 and two PMOS transistors 5 and 6, this static memory cell is referred to as six-transistor static memory cell or a perfect CMOS cell.

In more detail, two gates of the two transistors 1 and 2 are connected to a word line 10, and two drains of the transistors 1 and 2 are connected to two bit lines 11 and 12, respectively. A source of the transistor 1 and two drains of the two transistors 3 and 5 are connected in common to two gates of the transistors 4 and 6. On the other hand, a source of the transistor 2 and two drains of the two transistors 4 and 6 are connected in common to two gates of the transistors 3 and 5. Further, two sources of the transistors 5 and 6 are connected to a high potential voltage supply line, and two sources of the transistors 3 and 4 are connected to a low potential voltage supply line (grounded line). Therefore, data can be held or stored by the crossing structure of the feedback lines of these four transistors 3, 4, 5 and 6.

FIG. 7 is a plan view showing a standard layout of the static memory cell constructed as shown in FIG. 6. In FIG. 7, a diffusion layer arranged on a semiconductor substrate forms the drains and the sources of the MOSFET transistors 1, 2, 3, 4, 5 and 6; a poly silicon layer forms the word line 10, the gates of the MOSFETs 1, 2, 3, 4, 5 and 6 and local wires; a first metal layer forms local wires; and a second metal layer forms the bit lines 11 and 12 and local wires; the third metal layer form the high potential supply line and the low potential supply line (ground line) and the word line 10, respectively.

FIG. 8 is a cross-sectional view showing the layout of the same circuit shown in FIG. 7. Since the structure shown in FIG. 8 is well known in the art, the detailed description thereof is omitted here. Contact C formed on the source and drain S/D of the n- or p-MOSFET is connected to the first metal layer FML; and this first metal layer FML is connected to the second metal layer SML through a through hole V1, as shown.

Here, since the six-transistor static memory cell can be manufactured in accordance with the standard process technique for the logic LSI having three metal layers and one poly silicon layer, there exists such an advantage that some special purpose process techniques required for only the memory cell is not needed.

Further, a four-transistor static memory cell having an area smaller than that of the six-transistor static memory cell is well known. FIG. 9 is a circuit diagram showing this four-transistor static memory composed of four NMOSFETs 1, 2, 3 and 4 and two high resistances 7 and 8.

In more detail, two gates of the two transistors 1 and 2 are connected to the word line 10, and two drains of the transistors 1 and 2 are connected to the two bit lines 11 and 12, respectively. The source of the transistor 1 and the drain of the transistor 3 are connected to the gate of the transistors 4 and the high resistance 7. On the other hand, the source of the transistor 2 and the drain of the transistor 4 are connected to the gate of the transistor 3 and the high resistance 8. Further, two high resistances 7 and 8 are connected to the high potential voltage supply line, and the two sources of the transistors 3 and 4 are connected to the low potential voltage supply line (grounded line). Therefore, data can be held or stored by the crossing structure of the feedback lines of these two transistors 3 and 4 and the two high resistances 7 and 8.

The cell as described above is sometime referred to as a high resistance cell, in addition to the four-transistor cell.

FIG. 10 is a plan view showing a standard layout of the static memory cell constructed as shown in FIG. 9, in which the same reference numerals have been retained for similar parts or elements having the same functions as with the case shown in FIG. 9.

In FIG. 10, a diffusion layer arranged on a semiconductor substrate forms the drains and the sources of the MOSFET transistors 1, 2, 3 and 4 and the local wires; a first poly silicon layer forms the word lines 10, the gates of the MOSFETs 1, 2, 3 and 4, and the local wires; a second poly silicon layer forms the high resistance 7 and the high potential supply line; a first metal layer forms the low potential supply line (ground line), the word line 10, and the local wires; and the second metal layer forms the bit lines 11 and 12 and the local wires, respectively.

In the manufacturing process of the above-mentioned cell, although adopted to manufacture the general purpose SRAM, the formation of the second poly silicon layer, the first buried contact and the second buried contact are not adopted to manufacture the logic LSI. In other words, in order to manufacture the above-mentioned four-transistor static memory cell as shown in FIG. 9, some special purpose process techniques are additionally required. However, this four-transistor cell has such an advantage that the size can be reduced down to about ⅓ of the area of the six-transistor cell.

On the other hand, from the standpoint of the reduction in the memory cell area, a memory cell composed of one transistor and one capacitance (used for the DRAM) is the minimum in size. FIG. 11 shows this minimum cell, which is composed of an NMOSFET 2 having the drain connected to the bit line 12 and a gate connected to the word line 10, and a capacitance 9 connected between the source of the transistor 2 and the low potential voltage supply line. In this DRAM, however, since the access time is relatively slow, this cell cannot be used as a cache memory, in general.

In contrast with this, FIG. 12 shows a dynamic memory cell usable as the cache memory. This cell is basically the same in structure as that shown in FIG. 9, when the two high resistances 7 and 8 are removed in FIG. 9.

In order to realize the DRAM structure as shown in FIG. 12, the wiring layers are arranged as follows:

The diffusion layer arranged on a semiconductor substrate forms the drains and the sources of the MOSFET transistors 1, 2, 3 and 4, and the local wires; the poly silicon layer forms the word line 10, the gates of the MOSFETs 1, 2, 3 and 4, and the local wires; the first metal layer forms the low potential supply line (ground line), the word line 10, and the local wires; and the second metal layer forms the bit lines 11 and 12 and the local wires, respectively.

When constructed as described above, since no load resistance exists, a charge at an internal node of the transistor charged to the high potential can be held by the parasitic capacitance existing at this node. Therefore, in the case of the DRAM in general, refresh operation for rewriting the internal data at each time interval is needed. However, the four-transistor dynamic memory cell shown in FIG. 12 is provided with such an advantage that the data can be written by simply selecting the word line 10, which is different from the DRAM shown in FIG. 11. In other words, in the case of the memory cell as shown in FIG. 11, since the cell data is destroyed whenever the word line 10 is selected, it is necessary to repeat the rewrite operation by activating each sense amplifier.

As described above, in the case of the four-transistor dynamic memory cell, since the rewriting operation by use of the sense amplifier is not needed, the refresh operation can be very simplified.

Therefore, when the four-transistor dynamic memory cell is adopted, instead of the four-transistor static memory cell as shown in FIG. 9, since the special purpose manufacturing process for forming the second poly silicon layer and the second buried contact are not needed, it is possible to reduce the manufacturing cost thereof.

In this case, however, a problem arises when the normal read/write operation and the refresh operation occur at the same time. Here, however, as far as the four-transistor dynamic memory cell is used only as the four-transistor static memory, this problem can be solved by handling this concurrence as a cache miss and by keeping the normal operation waited. In other words, since the refresh time is as short as 100 μsec (which corresponds to a reduction in cache hit ratio of about 0.01%), the performance of the cache memory hardly deteriorates.

In summary, since the conventional semiconductor memory devices are constructed as described above, there exist the following problems:

In the case of the six-transistor static memory cell as shown in FIG. 6, since the memory size thereof is several times larger than that of the four-transistor static memory, when assembled with the logic LSI, there exists a problem in that the capacitance of the cache memory cannot be increased.

On the other hand, in the case of the four-transistor static memory as shown in FIG. 9, although the cell size can be reduced as that of the general purpose SRAM, since the special purpose manufacturing process for forming one additional wiring layer and two additional contact layers are further required, there exists a problem in that the manufacturing cost thereof inevitably increases markedly.

In contrast with this, in the case of the four-transistor dynamic memory cell as shown in FIG. 12, since the cell size is as small as that of the four-transistor static cell and further since the number of the special purpose manufacturing process can be reduced, this cell is suitable for assembling the cache memory with the logic without deteriorating the performance thereof. In this case, however, since the special purpose manufacturing process (the buried contact) is needed, it is impossible to perfectly reduce the manufacturing cost thereof. In addition, there exists another problem in that the buried contact is high in resistance so that the operation margin of the cell is reduced. In particular, when seen from the layout standpoint, in the feedback portion of the NMOS latch, one buried contact is formed at one node of the feedback loop but two buried contacts are formed on the other node of the feedback loop. Therefore, the electrical characteristics at the two internal nodes in the cell are not symmetrical with respect to each other, with the result it is impossible to disregard the deterioration of the cell characteristics. In the case of the general purpose SRAM, although this problem can be solved by strengthening the management of the buried contact process or by screening the contacts by performing a special test, in the case of the logic LSI of small quantity and diversified models, it is difficult to strengthen the process management and to perform the special test for the on-chip memory. In addition, since the poly silicon wire is used as the feedback wire and since the resistance of the poly silicon is not low in comparison with that of metal, there arises another problem in that the operation margin of the cell is lowered.

SUMMARY OF THE INVENTION

With these problems in mind, therefore, it is the object of the present invention to provide a semiconductor memory device or cell, which can reduce the on-chip memory area and increase the electric operation margin, while using only the standard manufacturing process for the logic LSI.

To achieve the above-mentioned object, the first embodiment shown in FIGS. 1 to 4 according to the present invention provides a semiconductor memory cell device composed of four transistors, two (M1, M1) of the four transistors constituting a latch circuit and remaining two (M2, M2) of the four transistors being used as a select transistor, respectively. The memory cell is composed of a first half and a second cell, each of the two half cells having the latch transistor (M1) and the select transistor (M2). Each of the two half cells is connected in such a way that a drain (D2) of the select transistor (M2) is connected to a bit line (BL1 or BL2), a source (S2) of the select transistor (M2) is connected in common to a drain (D1) of the latch transistor (M1), a source (S1) of the latch transistor (M1) is connected to a voltage supply line (S1), and a gate of the select transistor (M2) is connected to a word line (WL). Two half cells are connected in such a way that a gate of the latch transistor (M1) of the first half cell is connected to a junction point between the latch transistor (M1) and the select transistor (M2) of the second half cell, and a junction point between the latch transistor (M1) and the select transistor (M2) of the first half cell is connected to a gate of the latch transistor (M1) of the second half cell. The first and second half cells are formed opposingly on a semiconductor substrate in such a way that the four transistors are arranged on the semiconductor substrate so as to extend in a direction in the order of the select transistor (M2) and the latch transistor (M1) of the first half cell, and the latch transistor (M1) and the select transistor (M2) of the second half cell. The drain (D2) of the select transistor (M2) of the first half cell is formed outside of the select transistor (M2) of the first half cell; the common-connected source (S2) and/or drain (D1) of the two select and latch transistors (M2, M1) of the first half cell are formed between these two select and latch transistors (M2, M1) of the first half cell; and the two sources (S1, S2) of the two latch transistors (M1, M1) of the first and second half cells are formed between the same two latch transistors (M1, M1). The common-connected drain (D1) and/or source (S2) of the two latch and select transistors (M1, M2) of the second half cell are formed between these two latch and select transistors (M1, M2) of the second half cell; and the drain (D2) of the select transistor (M2) of the second half cell is formed outside of the select transistor (M2) of the second half cell. A first metal layer (FML) is formed over the semiconductor substrate, and a second metal layer (SML) is formed over the first metal layer in each half cell in such a way that the drain (D2) and a line of the first metal layer (FML) are connected to each other via a contact (C4). The same line of the first metal layer (FML) and a line of the second metal layer (SML) are connected to each other via a through hole B (V2). The source (S2) and/or the drain (D1) and the line of the first metal layer (FML) are connected to each other via a contact (C1), and the same line of the first metal layer (FML) and the line of the second metal layer (SML) are connected to each other via a through hole A (V1), the contact (C1) and the through hole A (V1) being stacked upon each other as a stacked via contact structure. The gate of the latch transistor (M1) and the line of the first metal layer (FML) are connected to each other via a contact (C2), the line of the first metal layer (FML) and the line of the second metal layer (SML) are connected to each other via a through hole C (V3), the line of the second metal layer (SML) connected to the through hole B (V2) is connected to the bit line (BL or BLa) formed by a third metal layer (TML); and the two half cells are connected to each other in such a way that the through hole C (V3) of the first half cell and the through hole A (V1) of the second half cell are connected to each other via a line (F2) of the second metal layer (SML). The through hole A (V1) of the first half cell and the through hole C (V3) of the second half cell are connected to each other via a line (F1) of the second metal layer (SML).

Further, the second embodiment shown in FIGS. 1 to 5 according to the present invention provides a semiconductor memory cell device composed of four transistors, two (M1, M1) of the four transistors constituting a latch circuit and remaining two (M2, M2) of the four transistors being used as a select transistor, respectively. The memory cell is composed of a first half and a second half cell, each of the two half cells having the latch transistor (M1) and the select transistor (M2). Each of the two half cells is connected in such a way that a drain (D2) of the select transistor (M2) is connected to a bit line (BL1 or BL2), a source (S2) of the select transistor (M2) is connected in common to a drain (D1) of the latch transistor (M1), a source (S1) of the latch transistor (M1) is connected to a voltage supply line (S1), and a gate of the select transistor (M2) is connected to a word line (WL). The two half cells are connected in such a way that a gate of the latch transistor (M1) of the first half cell is connected to a junction point between the latch transistor (M1) and the select transistor (M2) of the second half cell, and a junction point between the latch transistor (M1) and the select transistor (M2) of the first half cell is connected to a gate of the latch transistor (M1) of the second half cell. The first and second half cells are formed on a semiconductor substrate roughly in parallel to each other, when seen on a plan view, by arranging four transistors of the select transistor (M2) and the latch transistor (M1) of the first half cell, and the latch transistor (M1) and the select transistor (M2) of the second half cell. The drain (D2) of the select transistor (M2) of the first half cell is formed outside of the select transistor (M2) of the first half cell. The common-connected source (S2) and/or drain (D1) of the two select and latch transistors (M2, M1) of the first half cell are formed between these two select and latch transistors (M2, M1) of the first half cell; and the two sources (S1, S2) of the two latch transistors (M1, M1) of the first and second half cells are formed between the same two latch transistors (M1, M1). The common-connected drain (D1) and/or source (S2) of the two latch and select transistors (M1, M2) of the second half cell are formed between these two latch and select transistors (M1, M2) of the second half cell; and the drain (D2) of the select transistor (M2) of the second half cell is formed outside of the select transistor (M2) of the second half cell. A first metal layer (FML) is formed over the semiconductor substrate, and a second metal layer (SML) is formed over the first metal layer in each half cell in such a way that the drain (D2) and a line of the first metal layer (FML) are connected to each other via a contact (C4). The same line of the first metal layer (FML) and a line of the second metal layer (SML) are connected to each other via a through hole B (V2). The source (S2) and/or the drain (D1) and the line of the first metal layer (FML) are connected to each other via a contact (C1), and the same line of the first metal layer (FML) and the line of the second metal layer (SML) are connected to each other via a through hole A (V1), the contact (C1) and the through hole A (V1) being stacked upon each other as a stacked via contact structure. The gate of the latch transistor (M1) and the line of the first metal layer (FML) are connected to each other via a contact (C2). The line of the second metal layer (SML) connected to the through hole B (V2) is connected to the bit line (BL or BLa) formed by a third metal layer (TML). The two half cells are connected to each other in such a contact (C2) of the first half cell and a contact (C1) of the second half cell are connected to each other via a line (F2) of the first metal layer (FML), and the through hole A (V1) of the first half cell and the through hole C (V3) of the second half cell are connected to each other via a line (F2) of the second metal layer (SML).

Further, the present invention provides a semiconductor memory device having a latch circuit, comprising: a first MOSFET; a second MOSFET; a first wire of a first metal layer formed under a second metal layer, for electrically connecting a drain diffusion layer of said first MOSFET to a gate of said second MOSFET; a second wire of the first metal layer formed under the second metal layer, for electrically connecting a drain diffusion layer of said second MOSFET to a gate of said first MOSFET; a voltage supply wire for electrically connecting two sources of said first and second MOSFETs to a voltage supply line, respectively; a first contact for connecting the drain diffusion layer of said first MOSFET to the first wire of the first metal layer; and a first through hole formed being overlapped with said first contact, for connecting the first wire of the first metal layer to a first wire of the second metal layer.

Further, the present invention provides a semiconductor memory device, which comprises: a first MOSFET formed on a semiconductor substrate; a second MOSFET formed on the semiconductor substrate alongside of said first MOSFET; a first wire arranged in at least one of a first metal layer formed on the semiconductor substrate and a second metal layer formed over the first metal layer, for electrically connecting a drain of said first MOSFET to a gate of said second MOSFET; a second wire arranged in at least one of the first metal layer and the second metal layer, for electrically connecting a drain of said second MOSFET to a gate of said first MOSFET; a voltage supply line arranged in the first metal layer, for electrically connecting two sources of said first and second MOSFETs; a contact connecting at least one of two drains of said first and second MOSFETs to the first metal layer; and a first through hole with said contact, for connecting the first metal layer to the second metal layer.

Here, it is preferable that the semiconductor memory cell device composed of four transistors is a four-transistor dynamic one-port memory cell, which can refresh data held by the latch circuit when the word lines (WL, WLa) are selected within a predetermined time period.

In the semiconductor memory device according to the present invention, the four-transistor dynamic memory cell is formed in accordance with the stacked via contact process which has been now used as the standard process for the logic LSI. Here, the stacked via contact is a technique for forming an upper-layer contact over the lower-layer contact. Owing to this technique, it is possible to form the feedback paths of the two MOSFETs for constituting the latch by use of the metal wiring layers. As a result, it is possible to reduce the area of the memory cell down to that of the four-transistor dynamic memory cell. Further, since the stacked via contacts are adopted, the resistance of the contact can be reduced markedly, as compared with that of the buried contact, so that the electric characteristics of the memory cell can be improved markedly.

DETAILED DESCRIPTION OF THE EMBODIMENTS

Some embodiments of the semiconductor memory device according to the present invention will be described hereinbelow with reference to the attached drawings.

Figure 1:
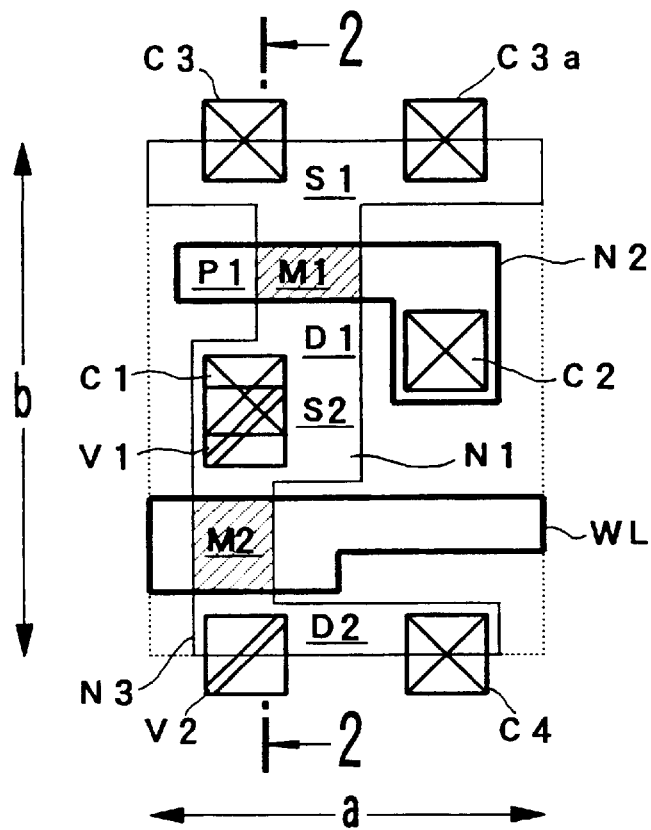
FIG. 1 is a plane view showing a first embodiment of the semiconductor memory device according to the present invention.
Figure 1:
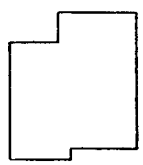
Figure 1:
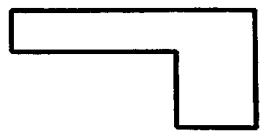
Figure 1:
Figure 1:
Figure 1:
Figure 2:
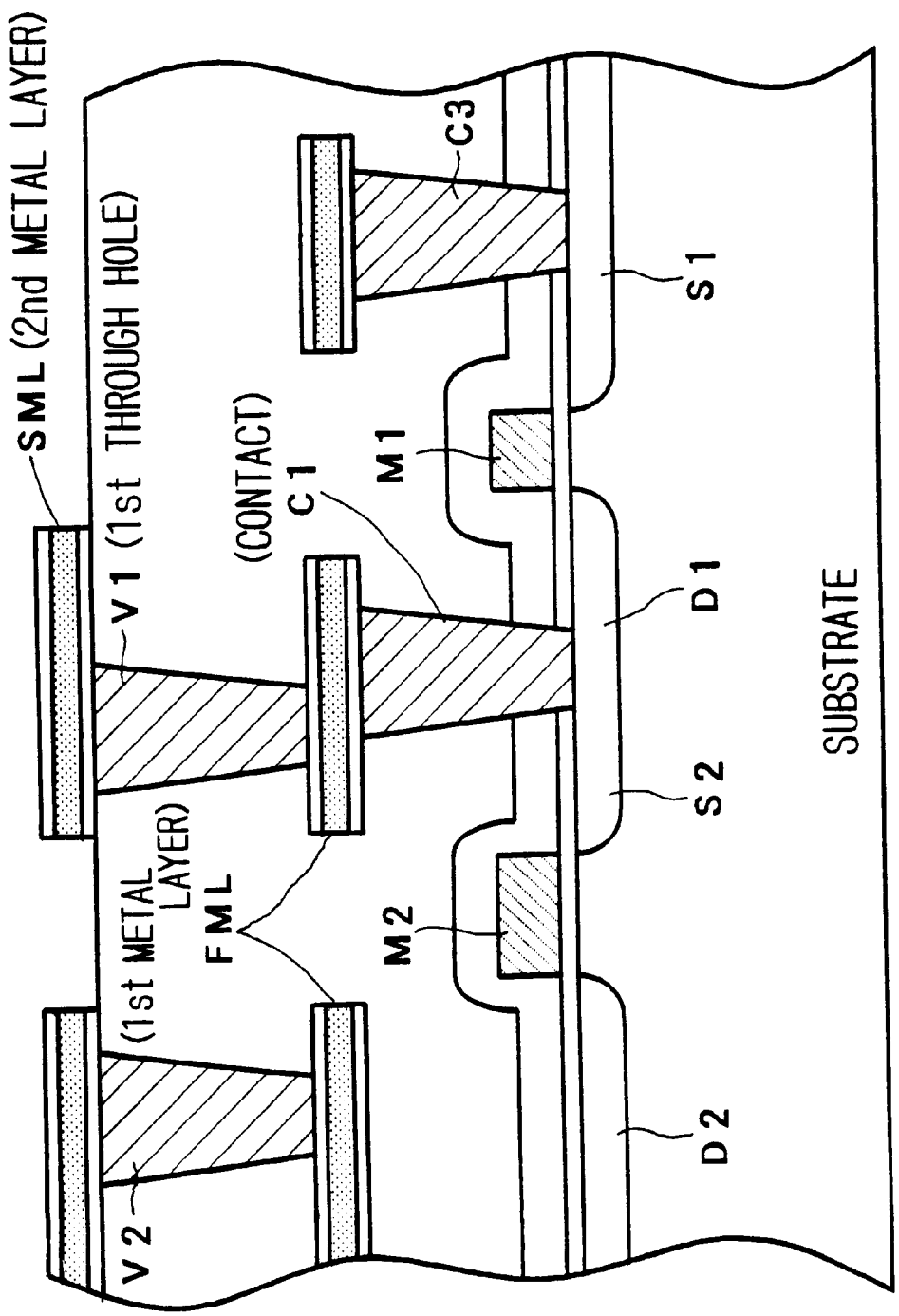
FIG. 2 is a cross-sectional view showing the first embodiment, taken along the line A—A shown in FIG. 1.
Figure 3:
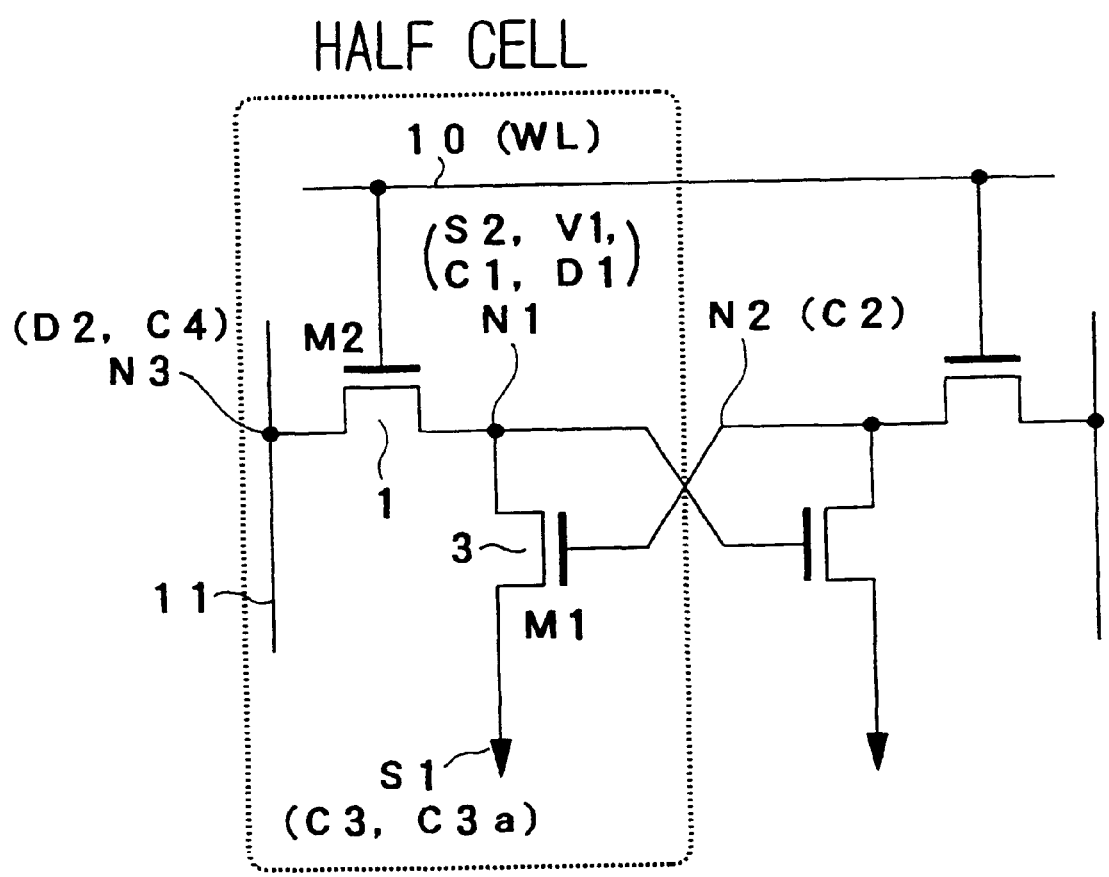
FIG. 3 is a circuit diagram showing the device construction shown in FIG. 1.

FIG. 1 is a plan view showing the first embodiment of the memory device, and FIG. 2 is a cross-sectional view taken along the line A—A in FIG. 1. FIG. 1 shows a layout of a one-port memory cell formed on a semiconductor substrate, in which two transistor regions are shown by two slash areas; a diffusion layer is shown by a solid line area; two poly silicon layers are shown by thick line areas; three contact areas are shown by three crossed areas; and two parts of first through holes are shown by double slash areas. Further, FIG. 3 is an equivalent circuit of this memory cell shown in FIG. 1. Therefore, a half cell portion shown in FIG. 2 corresponds to a half circuit of the one-port cell shown in FIG. 12. In other words, the one-port memory cell shown in FIG. 3 can be constructed by arranging two of the circuit shown in FIG. 2. Further, the layout shown in FIG. 1 corresponds to the half cell portion of the one-port cell.

In FIG. 1 or 2, a transistor M1 corresponds to the latch transistor 3 (shown in FIG. 3), and a transistor M2 corresponds to the transistor 1 (shown in FIG. 3) connected between the word line 10 and the bit line 11.

In the transistor M1, the drain diffusion layer D1 forms one internal node N1, and the poly silicon P1 forms the other internal node N2. The source diffusion layer S1 of the transistor M1 forms the ground potential supply line, and is further connected to the first metal layer (not shown) through the two contacts C3 and C3a. The two contacts C1 and C2 are connected to the first metal layer (the local wires of the internal nodes N1 and N2) or to the second metal layer (not shown). Further, the first through hole V1 is formed being overlapped with the contact C1, and further connected to the first metal layer (the local wire of the internal node N1) or the second metal.

As shown in FIG. 2, when the first through hole V1 formed on the upper layer is formed being overlapped with the contact C1 formed on the lower layer, the first through hole is referred to as a stacked via contact. This manufacturing process technique has been standardized for the recent logic LSI.

FIG. 2 shows the cross section of the semiconductor memory device constructed as described above, in which the stacked via contact construction is shown in more detail. As shown in FIG. 2, the hole portion of the lower layer contact C1 is buried with a filling substance (aluminum or poly silicon). Therefore, the upper portion of the contact C1 is flat, so that the first through hole V1 can be formed on this contact C1 for the following reasons:

Conventionally, since the contact is not filled with the filling substance, there exists a high difference at the contact portion, so that it has been impossible to from the through hole on the contact hole C1. Therefore, since the upper-layer through hole cannot be overlapped with the lower-layer contact, it has been necessary to separate the two away from each other by a constant distance. As a result, in the case of the logic LSI whose chip area is determined mainly by the design rule of the multi-layer metal wiring, the integration density is inevitably lowered. To overcome this problem, this stack via contact process has been adopted as the standard process. In this connection, in the case of the general purpose SRAM, this process is not adopted, because being unnecessary. Further, in this stacked via contact, any one of the internal nodes N1 and N2 is used as the drain, and it is not necessarily required to use both nodes as the drain.

With reference to FIG. 1 again, the N-type MOSFET M2 is a cell access transistor selectively activated by the word line WL. The source diffusion layer S2 of the transistor M2 is the drain diffusion layer D1 of the transistor M1. Further, the drain diffusion layer D2 is connected to the first metal layer through the contact C4, and further to the second metal layer through the first through hole V2. In this connection, in FIG. 1, although the first through hole V2 is formed as the stacked via contact, this is not necessarily required.

On the other hand, as one of the important design parameters of the four-transistor memory cell, there exists a β ratio, which can be expressed as

β=(W1/L1)×(W2/L2)

where L1 denotes the gate length of the transistor M1; W1 denotes the gate width of the transistor M1; L2 denotes the gate length of the transistor M2; and W2 denotes the gate width of the transistor M2. Further, it has been considered that the preferable value of this β ratio is more than three in the case of the four-transistor memory cell from the standpoint of electric stability. Although being dependent upon the balance of the design rule, in general the width "a" of the half cell is twice of the wiring pitch of the first metal layer (an addition of the minimum width and the minimum line space); the cell height "b" is a value corresponding to a value (an addition of twice of the contact size+twice of the minimum gate length+four times of the contact gate length). Therefore, in order to increase the β ratio, it is necessary to increase the width W1 or to decrease the gate length L1 of the transistor M1. However, since L1 is already determined on the basis of the minimum design rule, it is impossible to further reduce this value. Further, since the width W1 is maximized in FIG. 1, in order to increase the gate width W1, the width "a" of the half cell must be increased. Therefore, the size of the transistor M1 cannot be changed. On the other hand, in the case of the transistor M2, although the gate width W2 cannot be changed (because having been minimized), the gate length L2 can be increased without changing the cell size. Therefore, in the present invention, the diffusion layer wiring is extended in the right and left (horizontal) direction in FIG. 1, in such a way that the contact C4 can be arranged on as right the side as possible. Owing to the above-mentioned layout, it is possible to easily increase the β ratio more than three, without increasing the cell size, which is one of the features of the half cell of the present invention. In this case, however, since the area of the diffusion layer connected to the bit line is increased, there exists a problem in that the capacitance of the bit line may be increased. In this case, however, although the cell height "b" is somewhat increased, it is possible to reduce the harmful influence thereof by arranging the contact C4 just under the transistor M2.

Figure 4A:
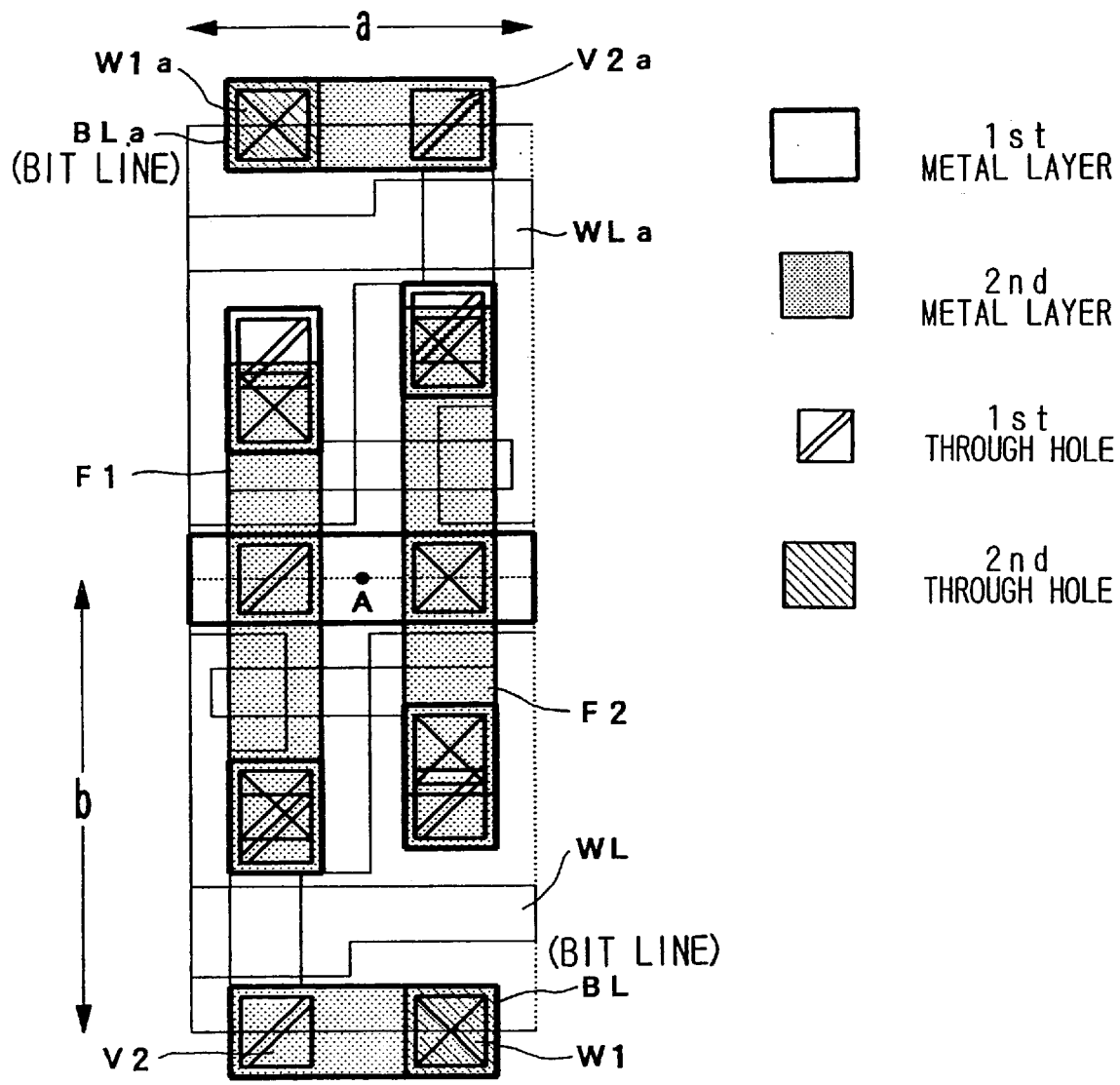
FIG. 4A is a plane view showing a second embodiment of the semiconductor memory device according to the present invention.
Figure 4A:
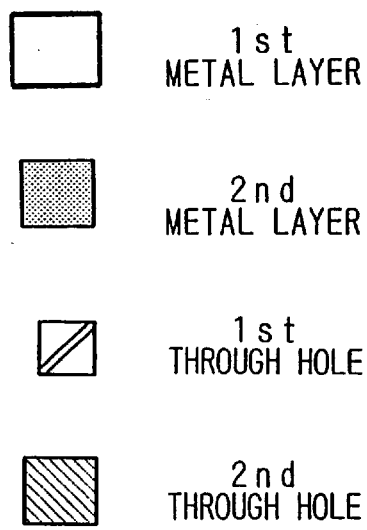
Figure 4B:
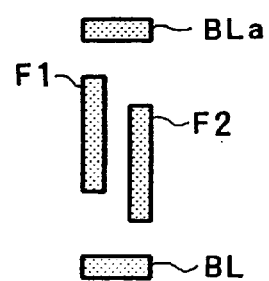
FIG. 4B is a view showing a partial layout of only the second metal layer shown in FIG. 4 A.

FIGS. 4(A) and 4(B) are plan views showing the second embodiment of the semiconductor memory device according to the present invention, in which FIG. 4(A) shows an example of the layout of a one-port dynamic memory cell using two half cells and composed of four-transistors, and FIG. 4(B) shows the partial layout of only the second metal layer.

In this second embodiment, two half cells are arranged vertically in such a way that the two supply lines can be used in common. In other words, the lower side portion of FIG. 4(A) corresponds to the half cell shown in FIG. 1, and two half cells are formed on both the upper and lower sides in symmetrical positional relationship with respect to each other about a point A. In the cell shown in FIG. 4, the two feedback local wires F1 and F2 formed between the gates and drains of the two transistors for constituting the latch are the second metal layer extending in parallel to each other and in the vertical direction so as to intersect the two wire lines WL and WLa. In this cell, two stacked via contacts are formed over the drains of both the internal nodes N1 and N2. Further, the stacked via contacts are used to connect the gates P1 and P2a to the local wires F1 and F2, respectively. By using the stacked via contacts, it is possible to use the second metal layer as the local wire, in the same area as that required to use the first metal layer as the local wire. Therefore, by using the stacked via contacts, it is possible to connect the local wires F1 and F2 formed by the second metal layer so as to pass over the ground voltage supply line formed by the first metal layer in parallel to the word lines WL and WLa.

Further, in FIG. 4, the two bit lines BL and BLa are arranged over the latch circuit and in parallel to the local wires F1 and F2 by use of a third metal layer. Further, two second metal layers V2 and V2a are connected to the two bit lines BL and BLa of two third metal layers V2 and V2a through two second through holes W1 and W1a, respectively. In this connection, the second through holes W1 and W1a can be connected to the second metal layers V2 and V2a, respectively by use of or without use of the stacked via contact.

Further, in this second embodiment, since the word lines WL and WLa of the two half cells are formed separately on the upper and lower sides, it is necessary to select or not to select the word lines by driving the two word lines WL and WLa at the same time and in the same phase. In this case, the simplest method thereof is to connect both the word lines WL and WL electrically in common.

Figure 6:
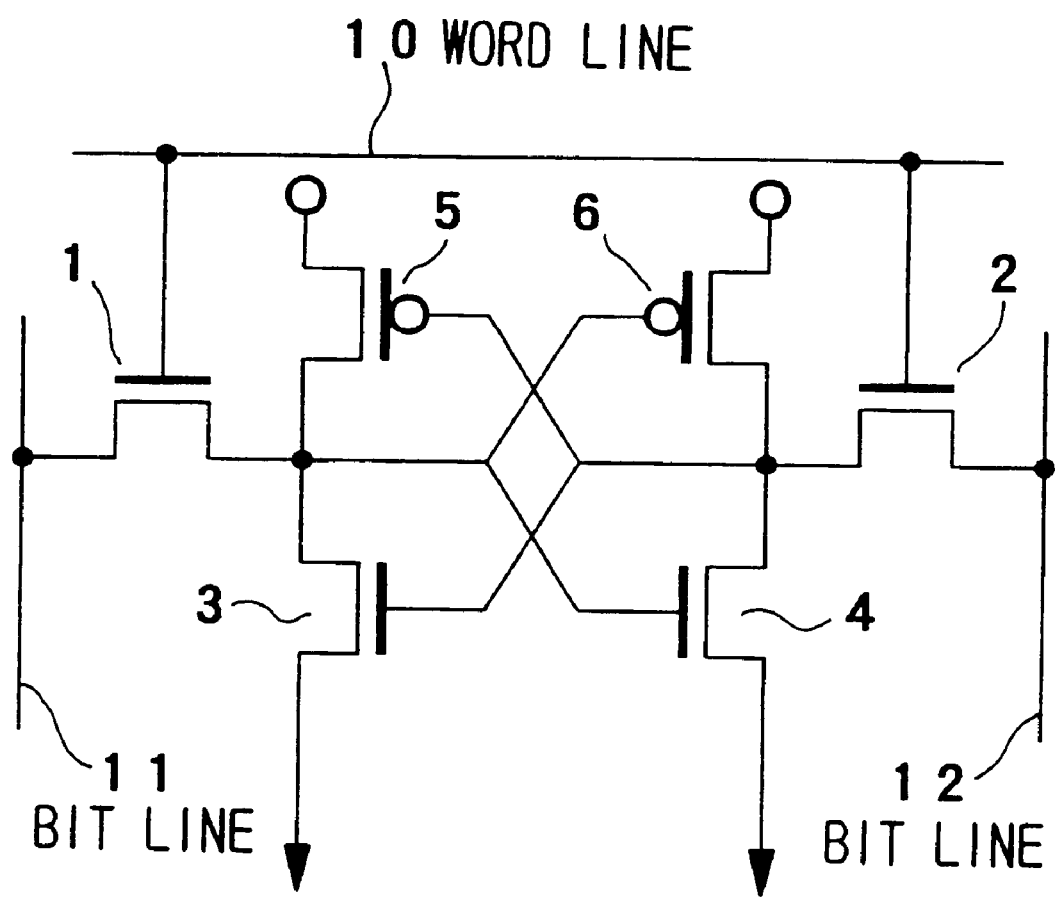
FIG. 6 is a circuit diagram showing a conventional six-transistor static memory cell.
Figure 7:
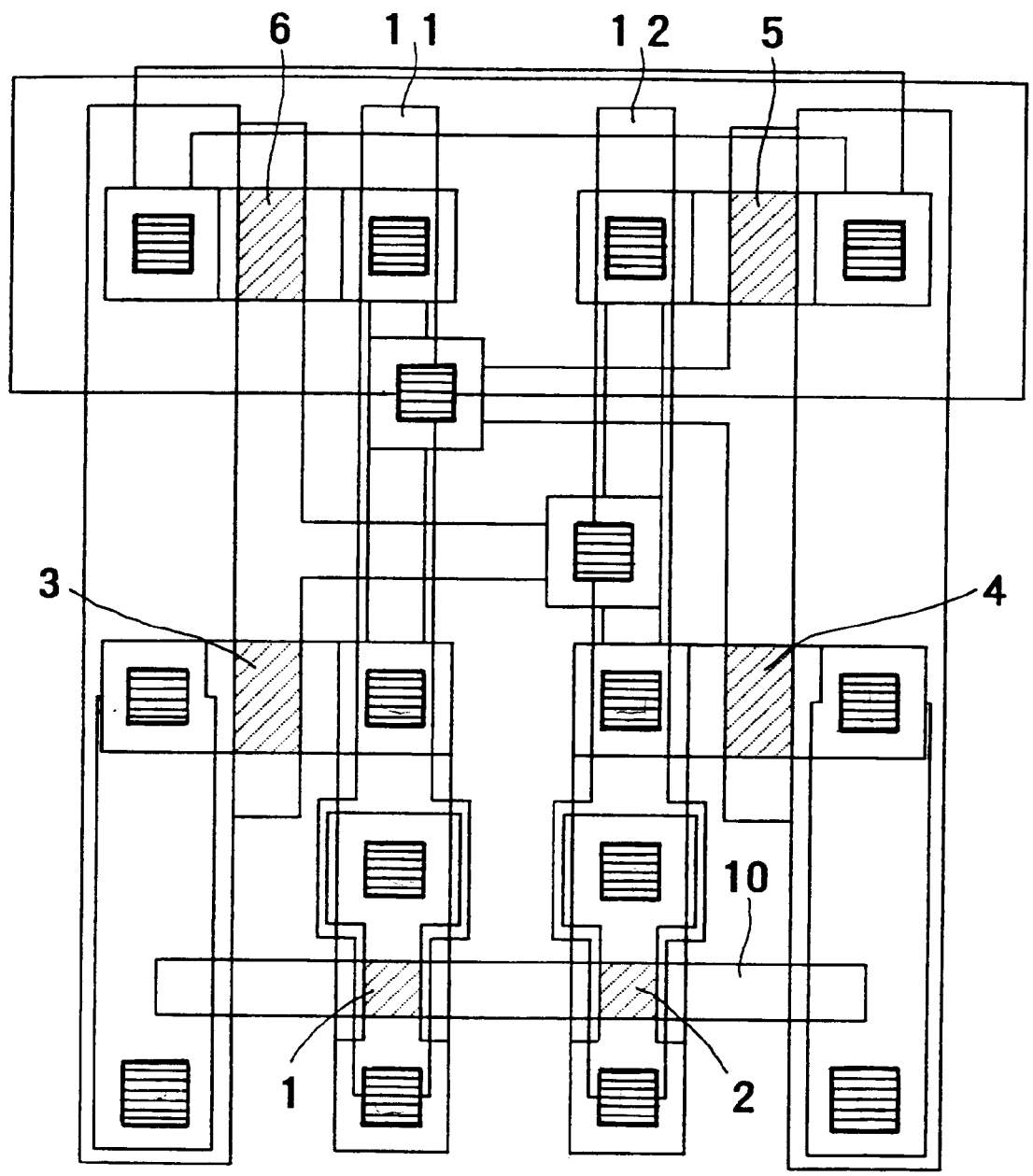
FIG. 7 is a plane view showing the same conventional static memory cell shown in FIG. 6.
Figure 8:
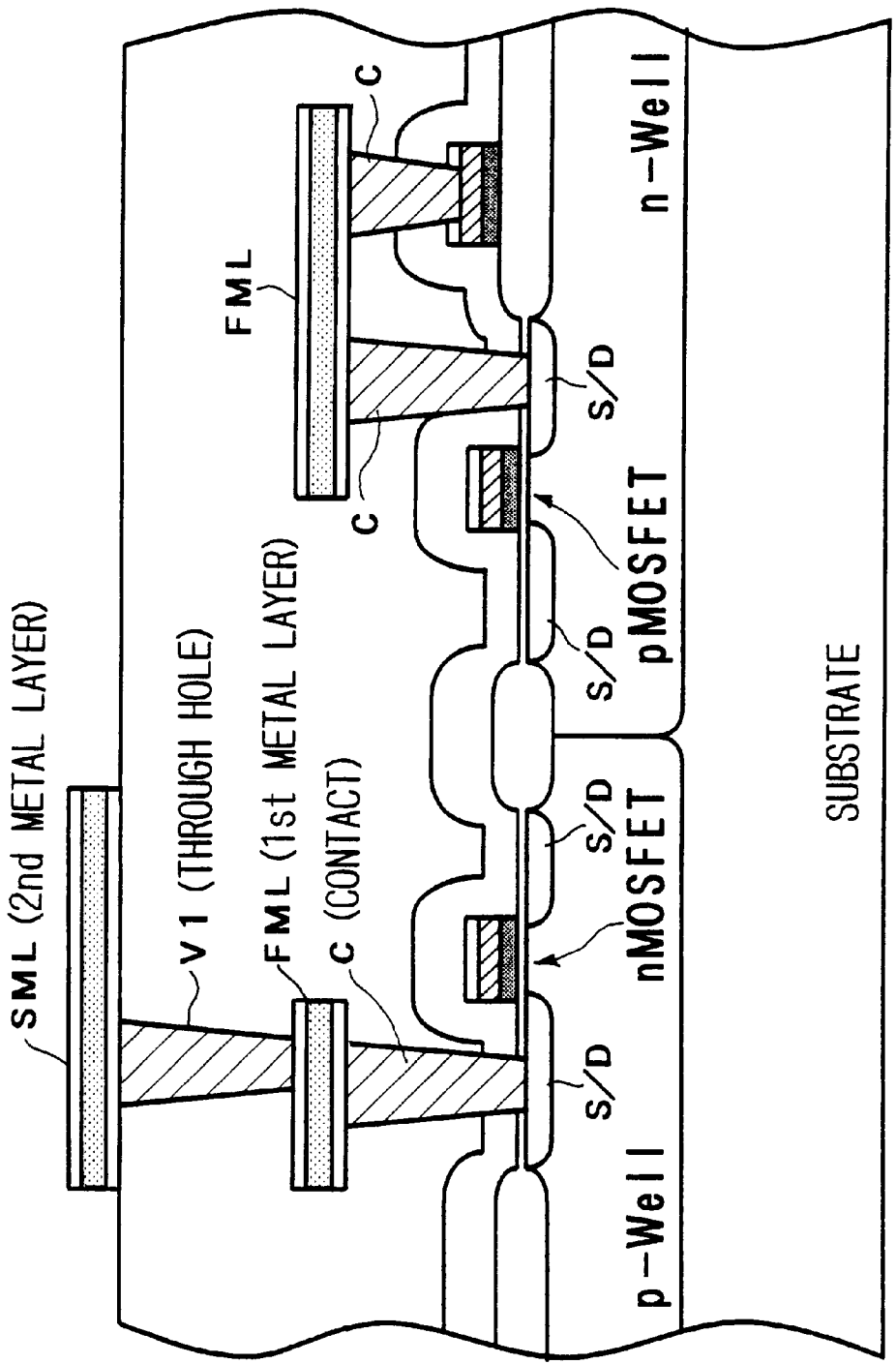
FIG. 8 is a cross-sectional view showing the same conventional static memory cell shown in FIG. 6.
Figure 9:
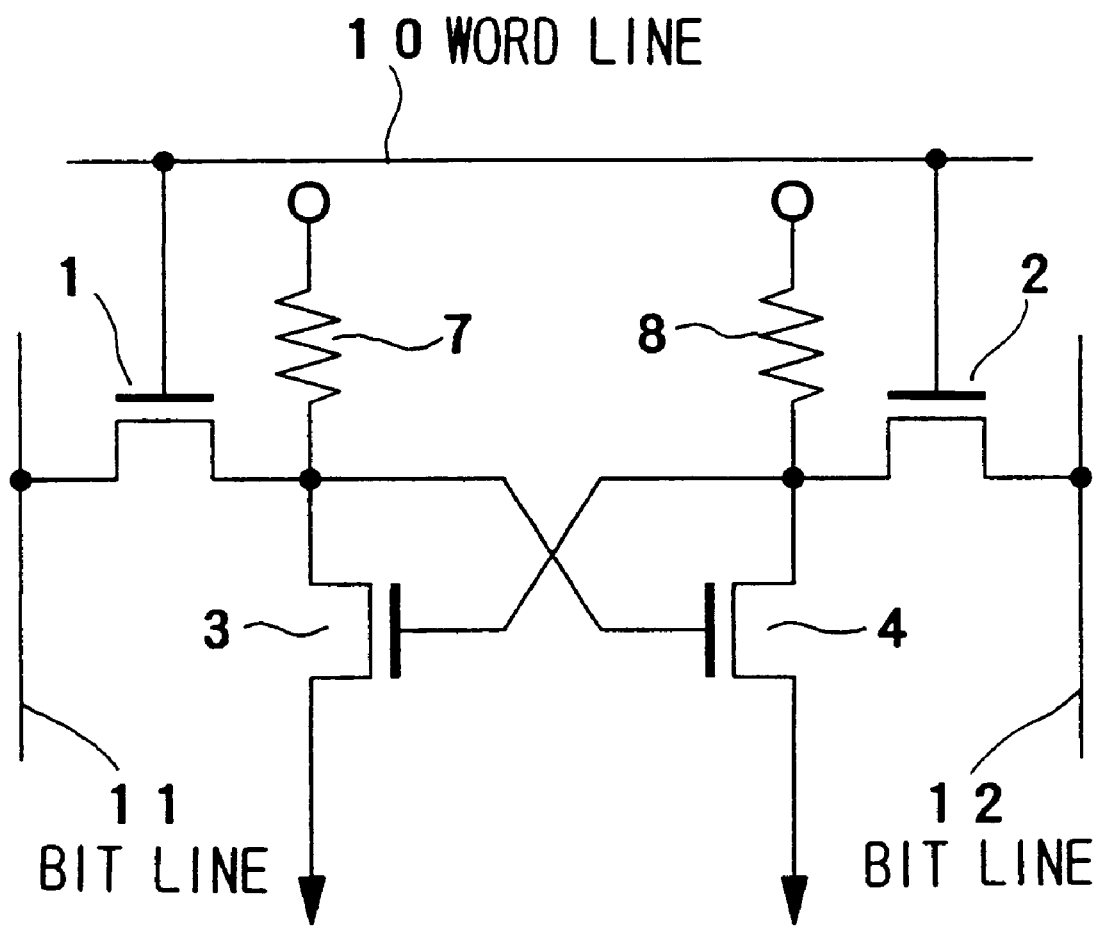
FIG. 9 is a circuit diagram showing a conventional four-transistor static memory cell.
Figure 10:
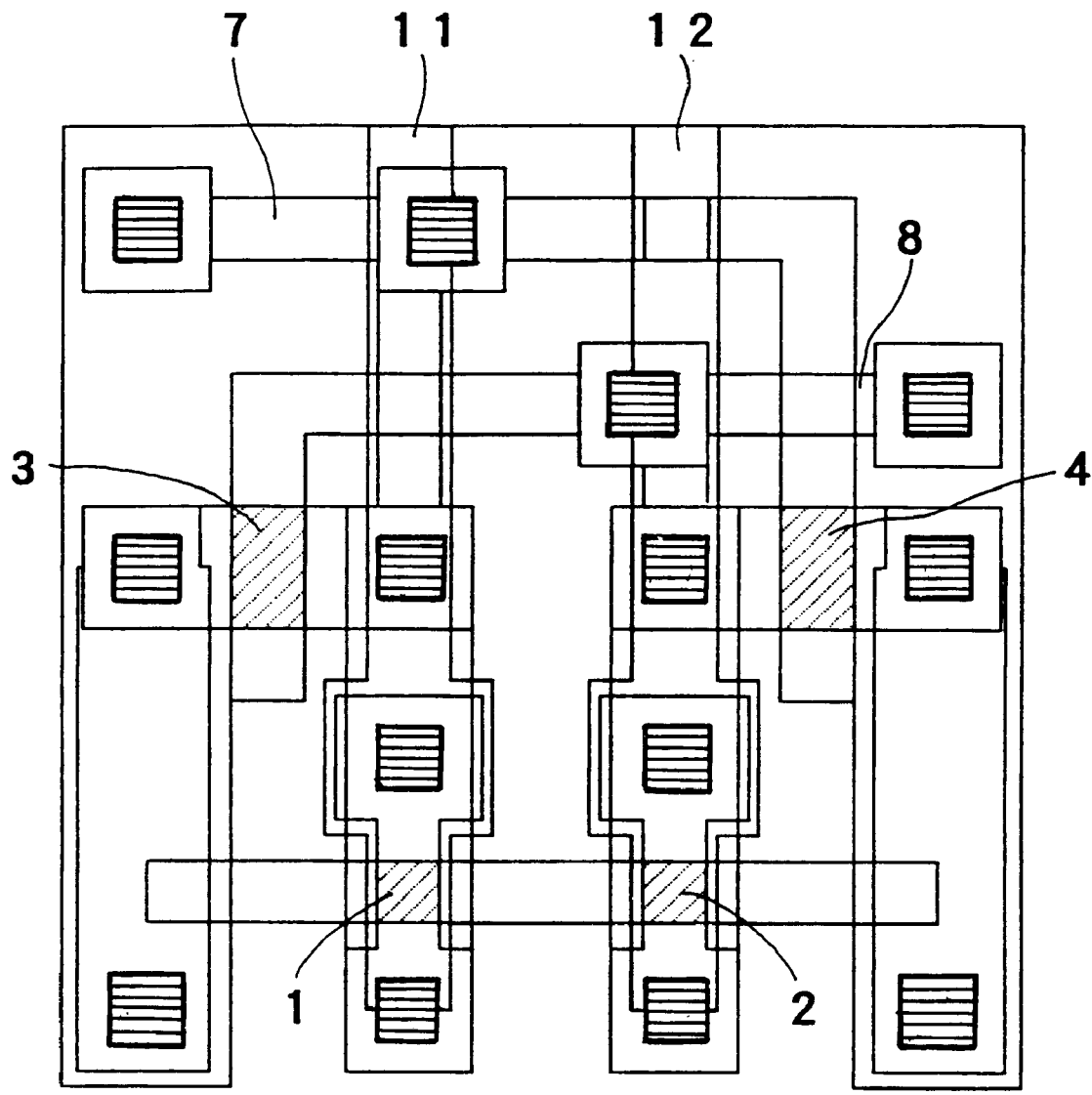
FIG. 10 is a plane view showing the same conventional static memory cell shown in FIG. 9.
Figure 11:
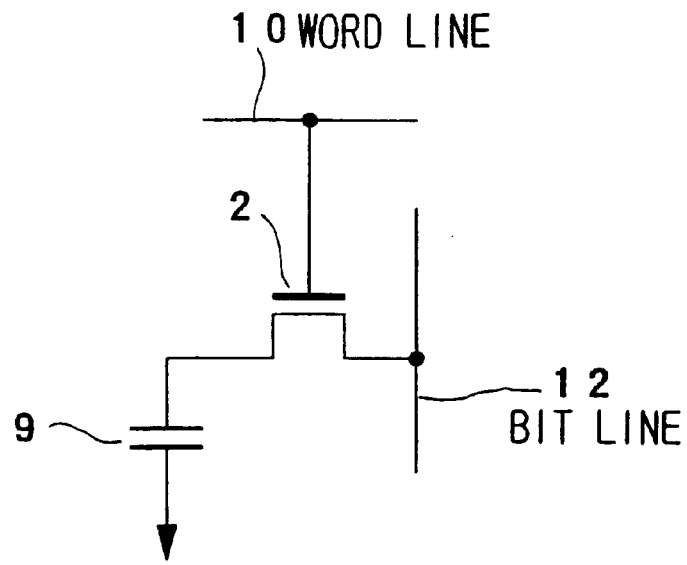
FIG. 11 is a circuit diagram showing a conventional dynamic memory cell.

Here, since the cell width "a" is the same as that of the half cell "a", the cell width "a" is twice wider than that of the metal wiring pitch of the first layer (or the second layer). In contrast with this, in the case of the six-transistor memory cell shown in FIG. 7, since the supply line formed on the third metal layer and the contact connected to the ground line must be formed on both sides of the cell, the cell width three times wider than that of the first metal layer wiring pitch is necessary. Therefore, the width of the cell shown in FIG. 4 can be reduced down to 33%, as compared with that of the conventional cell shown in FIG. 7. In addition, being different from the six-transistor memory cell shown in FIG. 7, since the P-type MOSFETs and the n-type MOSFETs are not mixed with each other within the cell, no cell separating regions are necessary and further the number of the transistors can be reduced. Therefore, the height of the cell shown in FIG. 4 can be reduced down to about 25%, as compared with that of the six-transistor memory cell shown in FIG. 6. In addition, when compared in accordance with the same design rule, it is possible to reduce the cell area of the present embodiment less than 50% of that of the six-transistor static memory cell. As a result, in the cell of the present embodiment, it is possible to mount the memory cells of twice capacitance in the same area, in comparison with the six-transistor static memory cell.

Now, in the device construction shown in FIG. 4, the diffusion layer is used as the drains and the sources of the MOSFETs; the poly silicon layer is used as the word lines and the gates of the MOSFETs; the first metal layer is used as the voltage supply line; the second metal layer is used as the local wires; and the third metal layer is used as the bit lines. Further, three sorts of interlayer junction layers (the contacts, the first through holes, and the second through holes) are used. These wiring layers and the contact layers can be formed perfectly by the standard process of the logic LSI, so that any special purpose process is not required to form this memory device. In spite of this fact, the area occupied by this memory device is roughly the same as that of the four-transistor dynamic memory cell as shown in FIG.

12 (in which only the first buried contact is formed by the special purpose process). Accordingly, the memory device of the present embodiment is advantageous, when seen from the cost standpoint, as compared with that shown in FIG. 12.

In addition, the memory cell shown in FIG. 4 is formed by using two half cells of quite the same layout, in symmetrical positional relationship with respect to each other about a point A. Further, the two feedback wires of the same length are formed in the same second layer. In addition, the resistances of the contacts and the through holes connected to the feedback wires are as low as being less than 1/100 of the conventional buried contact. Further, since the feedback wire itself is formed in the second metal layer, the resistance thereof is as low as being 1/1000 of that of poly silicon. Therefore, since the symmetrical characteristics of the memory cell are extremely excellent, as compared with those of the memory cell shown in FIG. 12, the electrical characteristics of the memory cell are also superior to those of the memory cell shown in FIG. 12, so that the operation thereof is more stabilized.

Figure 5:
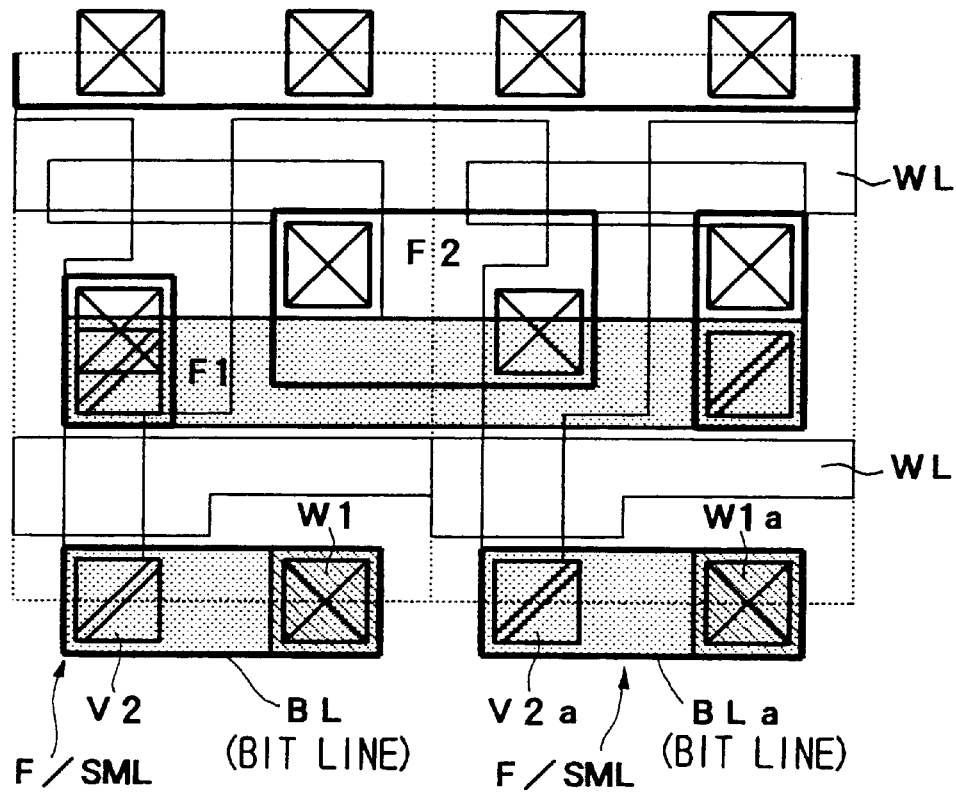
FIG. 5 is a plane view showing a third embodiment of the semiconductor memory device according to the present invention.

FIG. 5 is a plan view showing the third embodiment of the semiconductor memory device according to the present invention, in which another example of the layout of the one-port dynamic memory cell using two half cells and composed of four transistors is shown.

In this embodiment, two half cells are arranged adjacent to each other in symmetrical positional relationship with respect to each other in the horizontal direction. The two local wires F1 and F2 for feedback between the gates and the drains of the two transistors for constituting the latch circuit are arranged in the horizontal direction in parallel to the word lines. In this case, the local wire F1 uses the second metal layer, and the local wire F2 uses the first metal layer. Both the local wires F1 and F2 are arranged being overlapped with each other in the vertical direction. In this cell, the stacked via contact is formed only over the drain of the internal node N1. Further, the stacked via contact is used to connect the gate P1a to the local wire F1.

Further, in FIG. 5, the bit lines BL and BLa are formed over the latch circuit by use of the third metal layer so as to intersect the two local wires F1 and F2. Further, the second metal layers V2 and V2a are connected to the bit lines BL and BLa of the third metal layer through the two through holes W1 and W1a, respectively. The two through holes W1 and W1a are connected to the second metal layer V2 and V2a by use of or without use of the stacked via contact. Further, in FIG. 5, the portions denoted by F/SML denote the portion at which the first and second metal layers are perfectly overlapped with each other.

The size of the memory cell shown in FIG. 5 is quite the same as that of the cell shown in FIG. 4. Therefore, in the same way as with the case of FIG. 4, when compared in accordance with the same design rule, the cell area is less than 50% of that of the static memory cell composed of the six transistors. Therefore, in the memory cell according to the present embodiment, the memory cells of twice capacitance can be mounted in the same area, in comparison with the six-transistor static memory cell.

Figure 12:
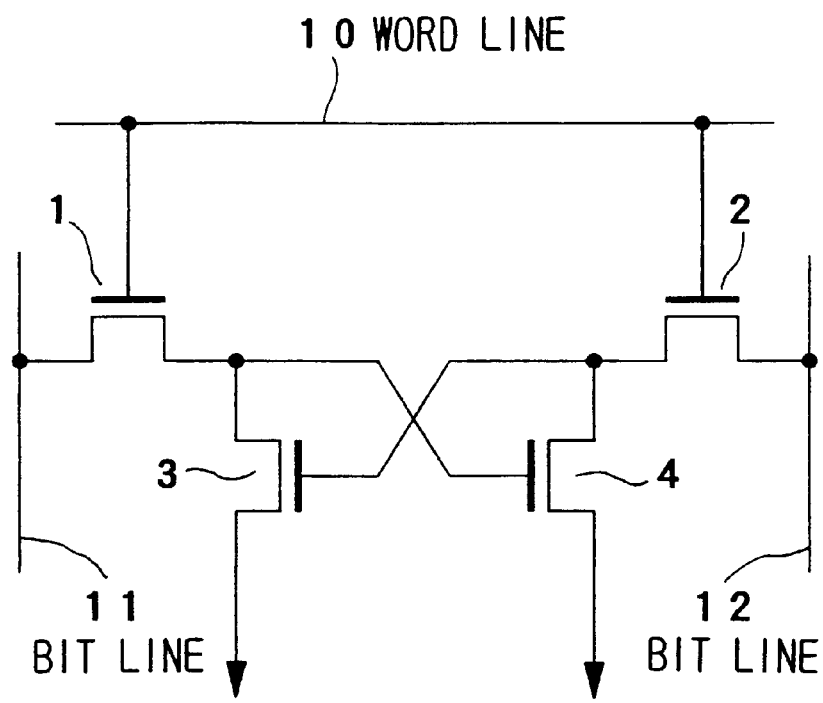
FIG. 12 is a circuit diagram showing a conventional four-transistor dynamic memory cell.

Now, in the device construction shown in FIG. 5, the diffusion layer is used as the drains and the sources of the MOSFETs; the poly silicon layer is used as the word lines and the gates of the MOSFETs; the first metal layer is used as the voltage supply lines and the local wires; the second metal layer is used as the local wires and the word lines; and the third metal layer is used as the bit lines. Further, three sorts of interlayer junction layers (the contacts, the first through holes, and the second through holes) are used. These wiring layers and the contact layers can be formed perfectly by the standard process of the logic LSI, so that any special purpose process is not required to form this memory device. In spite of this fact, the area occupied by this memory device is roughly the same as that of the four-transistor dynamic memory cell as shown in FIG. 12 (in which the first buried contact is formed by the special purpose process). Therefore, the manufacturing cost of the memory device of the present embodiment is lower than that of the memory cell as shown in FIG. 12.

The features of this third embodiment is that the horizontal width of the memory cell is decided by two bit lines. Therefore, since the space of the third metal layer remains in the bit line direction, it is possible to form the other wires such as data lines, with the result that it is possible to reduce the bus width, as the entire logic LSI, and thereby there exists such an effect that the chip size can be reduced.

In general, in the case of the large capacity memory, the metal word lines are formed in parallel to the poly silicon word lines, to reduce the delay of the word lines. In the case of the memory cell shown in FIG. 4, it is necessary to form the word lines of the first metal layer under the supply lines by using a fourth metal layer or by increasing the cell size somewhat in the vertical direction in FIG. 4. Therefore, although the memory cell is disadvantageous from the standpoint of cost, in the memory cell as shown in FIG. 5, since the word lines can be formed by the second metal layer without increasing the cell size, this memory cell shown in FIG. 5 is advantageous from the cost standpoint.

Further, in the memory cell shown in FIG. 5, one of the feedback wires is formed in the first metal layer, and the other of the feedback wires is formed in the second metal layer. In addition, since the two first through holes are connected between the two metal layers as resistances, it is considered that the electric symmetrical characteristics of the memory cell somewhat deteriorate, as compared with those of the memory cell as shown in FIG. 4. However, a difference in resistance between the two feedback wires is as extremely small as to be negligible (because the metal wire is used). Further, in the case where the two half cells are arranged symmetrically in the horizontal direction as shown in FIG. 5, it is known that the dispersion of the characteristics due to masking mismatch during the process is much smaller than those of the case where the two half cells are arranged symmetrically as shown in FIG. 4. In summary, the performance of the memory cell as shown in FIG. 5 is considered to be somewhat superior to the memory cell as shown in FIG. 4.

As described above, two examples of one-port memory cell have been explained as the second and third embodiments. However, since these memory devices are of four-transistor dynamic memory cell, it is of course necessary to provide an additional circuit for refreshing held data by selecting the word lines at regular intervals.

Further, when the special purpose process for the second poly silicon and the second buried contact are added to the basic process of the memory cell according to the present invention, it is possible to obtain the four-transistor static memory cell which requires no refresh and further to obtain the six-transistor static memory cell by adding two P-type MOSFETs to the four-transistor static memory cell.

Further, in the above-mentioned embodiments, although only the one-port memory cell using the half cells has been explained by way of example, it is of course possible to construct multi-port memory cell on the basis of the basic structure of the present invention. Further, the N-type MOSFETs can be of course replaced with the P-type MOSFETs.

Further, the similar functions and effects can be achieved, even when the complementary construction is formed by changing the ground voltage supply line to the high potential voltage supply line.

Further, when the cell array is formed by use of the memory cells shown in FIG. 4 or FIG. 5, the layout of the diffusion layer, the poly silicon and the contacts are all the same with respect to each other. Therefore, when the two half cells arranged in the vertical or horizontal direction are connected to each other by the personalized process of the layer metal, it is possible to double the word numbers or the bit numbers of the cell array. Further, when the decoder is somewhat improved, it is possible to use the cell array as an embedded array.

As described above, in the semiconductor memory device according to the present invention, since the four-transistor dynamic memory cell is formed in such a way that the feedback paths of the two MOSFETs for constituting a latch circuit are formed by metal wires in accordance with the stacked via contact process, in spite of the fact that only the standard process of the logic LSI is used, it is possible to reduce the cell area to about the same area required for the four-transistor dynamic memory cell formed in accordance with the special purpose buried contact process. In addition, it is possible to reduce the cell size down to about 50% of the six-transistor static memory cell formed in accordance with the standard process for the logic LSI. As a result, it is possible to realize an on-chip cache memory at a low cost. Here, since the resistance of the layer metal of the feedback wires is extremely smaller (by several figures), as compared with that of the poly silicon, there exists another effect such that the electric characteristics of the memory cell can be improved.

What is claimed is:

1. A semiconductor memory cell device composed of four transistors, two (M1, M1) of the four transistors constituting a latch circuit and two (M2, M2,) of the four transistors being used as a select transistor, respectively, wherein:

the memory cell is composed of a first half cell and a second half cell, each of the two half cells having the latch transistor (M1) and the select transistor (M2);

each of the two half cells is connected in such a way that a drain (D2) of the select transistor (M2) is connected to a bit line (BL1 or BL2), a source (S2) of the select transistor (M2) is connected in common to a drain (D1) of the latch transistor (M1), a source (S1) of the latch transistor (M1) is connected to a voltage supply line (S1), and a gate of the select transistor (M2) is connected to a word line (WL);

two half cells are connected in such a way that a gate of the latch transistor (M1) of the first half cell is connected to a junction point between the latch transistor (M1) and the select transistor (M2) of the second half cell, and a junction point between the latch transistor (M1) and the select transistor (M2) of the first half cell is connected to a gate of the latch transistor (M1) of the second half cell;

the first and second half cells are formed opposingly on a semiconductor substrate in such a way that the four transistors are arranged on the semiconductor substrate so as to extend in a direction in the order of the select transistor (M2) and the latch transistor (M1) of the first half cell, and the latch transistor (M1) and the select transistor (M2) of the second half cell;

the drain (D2) of the select transistor (M2) of the first half cell is formed outside of the select transistor (M2) of the first half cell; the common-connected source (S2) and/or drain (D1) of the two select and latch transistors (M2, M1) of the first half cell is formed between the two select and latch transistors (M2, M1) of the first half cell; and the two sources (S1, S1) of the two latch transistors (M1, M1) of the first and second half cells are formed between the same two latch transistors (M1, M1); the common-connected drain (D1) and/or source (S2) of the two latch and select transistors (M1, M2) of the second half cell is formed between the two latch and select transistors (M1, M2) of the second half cell; and the drain (D2) of the select transistor (M2) of the second half cell is formed outside of the select transistor (M2) of the second half cell;

a first metal layer (FML) is formed over the semiconductor substrate, and a second metal layer (SML) is formed over the first metal layer in each half cell in such a way that the drain (D2) and a line of the first metal layer (FML) are connected to each other via a contact (C4), the same line of the first metal layer (FML) and a line of the second metal layer (SML) are connected to each other via a through hole B (V2), the source (S2) and/or the drain (D1) and the line of the first metal layer (FML) are connected to each other via a contact (C1), and the same line of the first metal layer (FML) and the line of the second metal layer (SML) are connected to each other via a through hole A (V1), the contact (C1) and the through hole A (V1) being stacked upon each other as a stacked via contact structure, the gate of the latch transistor (M1) and the line of the first metal layer (FML) are connected to each other via a contact (C2), the line of the first metal layer (FML) and the line of the second metal layer (SML) are connected to each other via a through hole C (V3), the line of the second metal layer (SML) connected to the through hole B (V2) is connected to the bit line (BL or BLa) formed by a third metal layer (TML); and the two half cells are connected to each other in such a way that the through hole C (V3) of the first half cell and the through hole A (VI) of the second half cell are connected to each other via a line (F2) of the second metal layer (SML), and the through hole A (V1) of the first half cell and the through hole C (V3) of the second half cell are connected to each other via a line (F1) of the second metal layer (SML).

2. The semiconductor memory cell device composed of four transistors of claim 1, wherein the memory cell device is a four-transistor dynamic one-port memory cell, which can refresh data held by the latch circuit when the word lines (WL, WLa) are selected within a predetermined time period.

3. A semiconductor memory cell device composed of four transistors, two (M1, M1) of the four transistors constituting a latch circuit and two (M2, M2) of the four transistors being used as a select transistor, respectively, wherein:

the memory cell is composed of a first half cell and a second half cell, each of the two half cells having the latch transistor (M1) and the select transistor (M2);

each of the two half cells is connected in such a way that a drain (D2) of the select transistor (M2) is connected to a bit line (BL1 or BL2), a source (S2) of the select transistor (M2) is connected in common to a drain (D1) of the latch transistor (M1), a source (S1) of the latch transistor (M1) is connected to a voltage supply line (S1), and a gate of the select transistor (M2) is connected to a word line (WL);

two half cells are connected in such a way that a gate of the latch transistor (M1) of the first half cell is connected to a junction point between the latch transistor (M1) and the select transistor (M2) of the second half cell, and a junction point between the latch transistor (M1) and the select transistor (M2) of the first half cell is connected to a gate of the latch transistor (M1) of the second half cell;

the first and second half cells are formed on a semiconductor substrate roughly in parallel to each other, when seen on a plan view, by arranging four transistors of the select transistor (M2) and the latch transistor (M1) of the first half cell, and the latch transistor (M1) and the select transistor (M2) of the second half cell;

the drain (D2) of the select transistor (M2) of the first half cell is formed outside of the select transistor (M2) of the first half cell; the common-connected source (S2) and/or drain (D1) of the two select and latch transistors (M2, M1) of the first half cell is formed between the two select and latch transistors (M2, M1) of the first half cell; and the two sources (S1, S1) of the two latch transistors (M1, M1) of the first and second half cells are formed between the same two latch transistors (M1, M1); the common-connected drain (D1) and/or source (S2) of the two latch and select transistors (M1, M2) of the second half cell is formed between the two latch and select transistors (M1, M2) of the second half cell; and the drain (D2) of the select transistor (M2) of the second half cell is formed outside of the select transistor (M2) of the second half cell;

a first metal layer (FML) is formed over the semiconductor substrate, and a second metal layer (SML) is formed over the first metal layer in each half cell in such a way that the drain (D2) and a line of the first metal layer (FML) are connected to each other via a contact (C4), the same line of the first metal layer (FML) and a line of the second metal layer (SML) are connected to each other via a through hole B (V2), the source (S2) and/or the drain (D1) and the line of the first metal layer (FML) are connected to each other via a contact (C1), and the same line of the first metal layer (FML) and the line of the second metal layer (SML) are connected to each other via a through hole A (V1), the contact (C1) and the through hole A (V1) being stacked upon each other as a stacked via contact structure, the gate of the latch transistor (M1) and the line of the first metal layer (FML) are connected to each other via a contact (C2), the line of the second metal layer (SML) connected to the through hole B (V2) is connected to the bit line (BL or BLa) formed by a third metal layer (TML); and the two half cells are connected to each other in such a way that the contact (C2) of the first half cell and a contact (C1) of the second half cell are connected to each other via a line (F2) of the first metal layer (FML), and the through hole A (V1) of the first half cell and the through hole C (V3) of the second half cell are connected to each other via a line (F2) of the second metal layer (SML).

4. The semiconductor memory cell device composed of four transistors of claim 3, wherein the memory cell device is a four-transistor dynamic one-port memory cell, which can refresh data held by the latch circuit when the word lines (WL, WLa) are selected within a predetermined time period.

5. A semiconductor memory device having a latch circuit, comprising:
    a first MOSFET;
    a second MOSFET;
    a first wire of a first metal layer formed under a second metal layer, for electrically connecting a drain diffusion layer of said first MOSFET to a gate of said second MOSFET;
    a second wire of the first metal layer formed under the second metal layer, for electrically connecting a drain diffusion layer of said second MOSFET to a gate of said first MOSFET;
    a voltage supply wire for electrically connecting two sources of said first and second MOSFETs to a voltage supply line, respectively;
    a first contact for connecting the drain diffusion layer of said first MOSFET to the first wire of the first metal layer; and
    a first through hole formed being overlapped with said first contact, for connecting the first wire of the first metal layer to a first wire of the second metal layer.

6. The semiconductor memory device having a latch circuit of claim 5, which further comprises:
    a third MOSFET having a source electrically connected to the drain of said first MOSFET;
    a fourth MOSFET having a source electrically connected to the drain of said second MOSFET;
    a first word line electrically connected to a gate of said third MOSFET;
    a second word line electrically connected to a gate of said fourth MOSFET;
    a first bit line electrically connected to a drain of said third MOSFET; and
    a second bit line electrically connected to a drain of said fourth MOSFET.

7. The semiconductor memory device having a latch circuit of claim 6, wherein said first word line and said second word line are connected in common electrically.

8. The semiconductor memory device having a latch circuit of claim 5, which further comprises:
    a second contact for connecting the drain diffusion layer of said second MOSFET to a second wire of the first metal layer; and
    a second through hole formed being overlapped with said second contact, for connecting the second wire of the first metal layer to a second wire of the second metal layer.

9. The semiconductor memory device having a latch circuit of claim 5, which further comprises:
    a third contact for connecting a poly silicon gate layer of said second MOSFET to a third wire of the first metal layer; and
    a third through hole formed being overlapped with said third contact, for connecting the third wire of the first metal layer to the first wire of the second metal layer.

10. The semiconductor memory device having a latch circuit of claim 5, which further comprises:
    a fourth contact for connecting a poly silicon gate layer of said first MOSFET to a fourth wire of the first metal layer; and
    a fourth through hole formed being overlapped with said fourth contact, for connecting the fourth wire of the first metal layer to the second wire of the second metal layer.

11. The semiconductor memory device having a latch circuit of claim 8, wherein said first MOSFET and said second MOSFET are formed opposingly with said voltage supply line between said two first and second MOSFETs; said voltage supply line is formed by use of the first metal layer; the first and second wires are formed by use of the second metal layer; and said first MOSFET and said second MOSFET are connected to each other by wire passed over said voltage supply line.

12. The semiconductor memory device having a latch circuit of claim 5, wherein said first MOSFET and said second MOSFET are formed adjacent to each other; the second wire is formed by the first metal layer; and the first wire of the second metal layer and the second wire of the first metal layer are formed being stacked upon and in parallel to each other with a vertical gap between the two wires.

13. The semiconductor memory device having a latch circuit of claim 7, wherein the first wire and the second wire are formed in parallel to said first and second word lines.

14. The semiconductor memory device having a latch circuit of claim 7, wherein the first wire and the second wire are formed in parallel to said voltage supply line.

15. The semiconductor memory device having a latch circuit of claim 12, wherein said first and second bit lines are formed by use of a third metal layer formed over the second metal layer in such a way as to pass over the latch circuit.

16. The semiconductor memory device having a latch circuit of claim 15, wherein the memory cell device is a four-transistor dynamic one-port memory cell including a refresh circuit for refreshing data held by the latch circuit when said first and second word lines are selected within a predetermined time period.

17. A semiconductor memory device, which comprises:
   a first MOSFET formed on a semiconductor substrate;
   a second MOSFET formed on the semiconductor substrate alongside of said first MOSFET;
   a first wire arranged in at least one of a first metal layer formed on the semiconductor substrate and a second metal layer formed over the first metal layer, for electrically connecting a drain of said first MOSFET to a gate of said second MOSFET;
   a second wire arranged in at least one of the first metal layer and the second metal layer, for electrically connecting a drain of said second MOSFET to a gate of said first MOSFET;
   a voltage supply line arranged in the first metal layer, for electrically connecting two sources of said first and second MOSFETs;
   a contact connecting at least one of two drains of said first and second MOSFETs to the first metal layer; and
   a first through hole arranged being overlapped with said contact, for connecting the first metal layer to the second metal layer.

18. The semiconductor memory device of claim 17, which further comprises:
   a third MOSFET having a source electrically connected to the drain of said first MOSFET;
   a fourth MOSFET having a source electrically connected to the drain of said second MOSFET;
   a word line electrically connected to gates of said third and fourth MOSFETs; and
   bit lines electrically connected to drains of said third and fourth MOSFETs, respectively.

19. The semiconductor memory device of claim 18, wherein said word line is formed in at least one of a poly silicon layer formed on the semiconductor substrate and the second metal layer.

20. The semiconductor memory device of claim 19, wherein said bit lines are formed in a third metal layer arranged further over the second metal layer formed on the semiconductor substrate.

21. The semiconductor memory device of claim 20, wherein at least two of said contacts for connecting the poly silicon layer to the first metal layer, said first through hole for connecting the first metal layer to the second metal layer, and a second through hole for connecting the second metal layer to the third metal layer are formed being overlapped with each other.

* * * * *